United States Patent
Ishiguro et al.

(10) Patent No.: US 10,847,642 B2
(45) Date of Patent: Nov. 24, 2020

(54) COMPOUND SEMICONDUCTOR DEVICE AND FABRICATION METHOD

(71) Applicant: FUJITSU LIMITED, Kawasaki (JP)

(72) Inventors: Tetsuro Ishiguro, Kawasaki (JP); Junji Kotani, Atsugi (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 57 days.

(21) Appl. No.: 16/014,548

(22) Filed: Jun. 21, 2018

(65) Prior Publication Data

US 2019/0006503 A1 Jan. 3, 2019

(30) Foreign Application Priority Data

Jun. 30, 2017 (JP) .................................. 2017-129145

(51) Int. Cl.
| | |
|---|---|
| *H01L 29/778* | (2006.01) |
| *H01L 29/66* | (2006.01) |
| *H01L 29/06* | (2006.01) |
| *H01L 29/08* | (2006.01) |
| *H01L 29/201* | (2006.01) |
| *H01L 29/20* | (2006.01) |

(52) U.S. Cl.
CPC ...... *H01L 29/7786* (2013.01); *H01L 29/0657* (2013.01); *H01L 29/0843* (2013.01); *H01L 29/0847* (2013.01); *H01L 29/201* (2013.01); *H01L 29/66462* (2013.01); *H01L 29/2003* (2013.01)

(58) Field of Classification Search
CPC ............. H01L 29/7786; H01L 29/0657; H01L 29/0847; H01L 29/0843; H01L 29/201; H01L 29/66462; H01L 29/2003
See application file for complete search history.

(56) References Cited

U.S. PATENT DOCUMENTS

| | | | |
|---|---|---|---|
| 2002/0017648 A1* | 2/2002 | Kasahara | .......... H01L 21/28575 257/79 |
| 2016/0190278 A1* | 6/2016 | Yamada | .............. H01L 21/0262 363/37 |
| 2017/0104093 A1* | 4/2017 | Takado | ............. H01L 29/66462 |

FOREIGN PATENT DOCUMENTS

| | | |
|---|---|---|
| JP | 2002-016245 | 1/2002 |
| JP | 2014-110320 | 6/2014 |

* cited by examiner

*Primary Examiner* — Steven H Loke
*Assistant Examiner* — Juanita B Rhodes
(74) *Attorney, Agent, or Firm* — Fujitsu Patent Center

(57) ABSTRACT

Disclosed is a compound semiconductor device that includes an electron transit layer; an electron supply layer disposed above the electron transit layer, and including a first region and a second region, the second region having a composition higher in Al than the first region and covering the first region from at least a bottom part of the second region; a first electrode disposed above the first region; and a second electrode disposed above the second region.

21 Claims, 15 Drawing Sheets

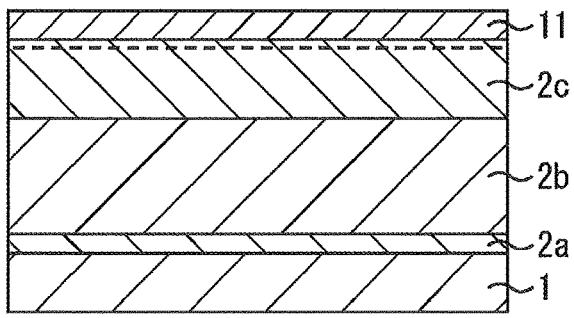
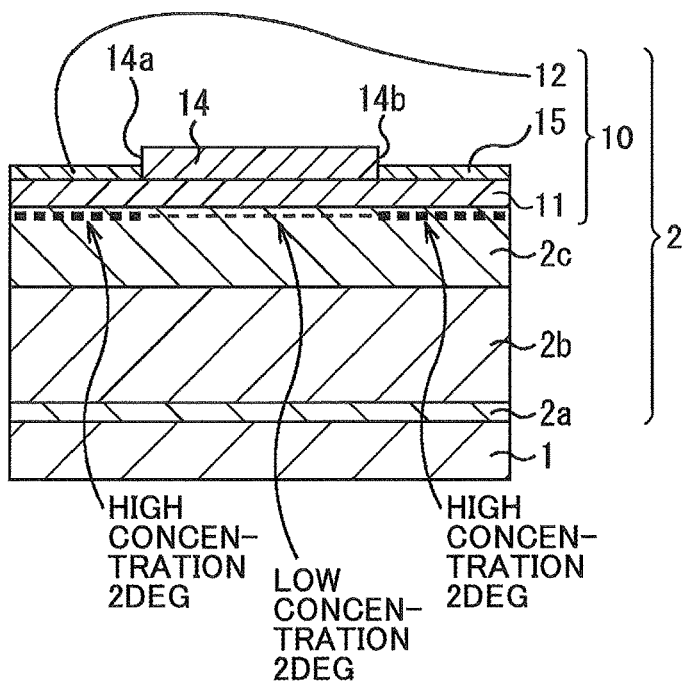
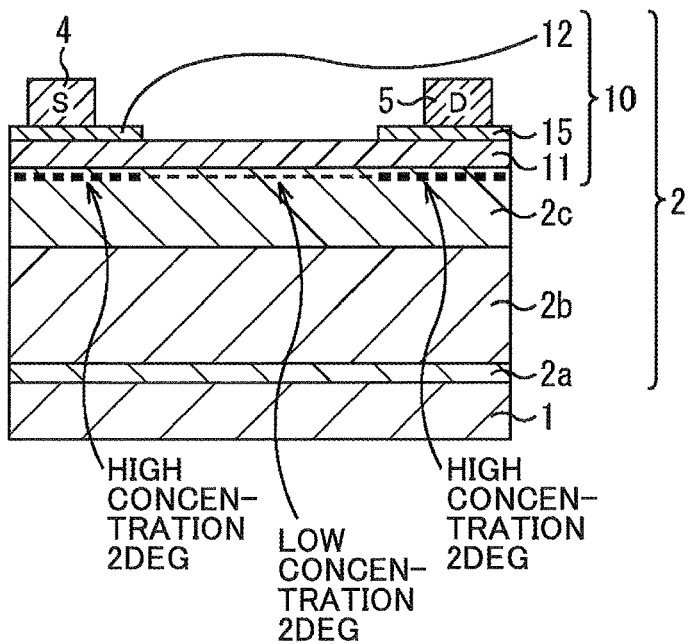

FIG.13

|  | (a) | (b) | (c) |
|---|---|---|---|
| 2DEG | SUFFICIENT ← | | |
| CURRENT COLLAPSE | | → | SUFFI-CIENT |

US 10,847,642 B2

COMPOUND SEMICONDUCTOR DEVICE AND FABRICATION METHOD

CROSS-REFERENCE TO RELATED APPLICATION

This patent application is based upon, and claims the benefit of priority of Japanese Patent Application No. 2017-129145 filed on Jun. 30, 2017, the entire contents of which are incorporated herein by reference.

FIELD

The disclosures discussed herein relate to a compound semiconductor device and a fabrication method.

BACKGROUND

Studies have been conducted on the application of nitride semiconductors in high withstand voltage and high power semiconductor devices having characteristics such as high saturated electron velocity and wide bandgap. For example, the bandgap of gallium nitride (GaN), i.e., a nitride semiconductor, is 3.4 eV, which is greater than the bandgap (1.1 eV) of silicon (Si) and the bandgap (1.4 eV) of gallium arsenide (GaAs), and has high breakdown electric field strength. Therefore, GaN is highly promising as a material for power supply semiconductor devices for exhibiting high voltage operation and high power.

For semiconductor devices using a nitride semiconductor, development of high power and high frequency devices has been vigorously undertaken using two-dimensional electron gas (2DEG) as a transit carrier, which is generated densely at an interface by utilizing the strong polarization effect unique to the nitride material. A typical example of such a semiconductor device may be GaN HEMI (GaN High Electron Mobility Transistor).

RELATED ART DOCUMENTS

Patent Documents

Patent Document 1: Japanese Laid-open Patent Publication No. 2014-110320
Patent Document 2: Japanese Laid-open Patent Publication No. 2002-16245

The degraded arithmetic operation speed may be improved by reducing the size of the output stage. However, the output stage having a reduced size may fail to sufficiently absorb the current of the differential input stage, which may result in unstable operations of the operational amplifiers. There presently appears to be no operational amplifier that includes the reduced-sized output stage.

As described above, there seems to be no operational amplifier having a reduced-sized output stage and exhibiting stable operations among the related art operational amplifiers.

SUMMARY

According to another aspect of an embodiment, a compound semiconductor device includes
an electron transit layer;
an electron supply layer disposed above the electron transit layer, and including a first region and a second region, the second region having a composition higher in Al than the first region and covering the first region from at least a bottom part of the second region;
a first electrode disposed above the first region; and
a second electrode disposed above the second region.

According to another aspect of an embodiment, a method for fabricating a compound semiconductor device is disclosed. The method includes
forming an electron transit layer;
forming an electron supply layer above the electron transit layer including a first region and a second region, the second region having a composition higher in Al than the first region and covering the first region from at least a bottom part of the second region; and
forming a first electrode and a second electrode above the first region and the second region, respectively.

The object and advantages of the invention will be realized and attained by means of the elements and combinations particularly pointed out in the appended claims.

It is to be understood that both the foregoing general description and the following detailed description are exemplary and explanatory and are not restrictive of the invention.

Additional objects and advantages of the embodiments will be set forth in part in the description which follows, and in part will be obvious from the description, or may be learned by practice of the invention.

BRIEF DESCRIPTION OF THE DRAWINGS

FIGS. 5A, 5B, and 5C are schematic cross-sectional views illustrating main steps in a method of fabricating an AlGaN/GaN HEMT according to first modification of the first embodiment;

FIG. 13 is a schematic diagram illustrating a relationship between 2DEG concentration and current collapse (electric characteristic deterioration caused by carrier trapping due to crystal defects) in the respective distribution types (a), (b), and (c) of FIGS. 12A, 12B, and 12C;

DESCRIPTION OF EMBODIMENTS

The GaN HEMT has a multilayer structure of an electron transit layer and an electron supply layer; the GaN HEMT has a significant feature of achieving a high power operation by generating 2DEG as transit carriers in the electron transit layer at a high concentration. However, since the GaN HEMT has a high electron density, a strong electric field may concentrate on the gate electrode end facing the drain electrode during high-frequency operation, which may result in dielectric breakdown. The drain voltage, which is the threshold value for such breakdown, is referred to as a gate-drain breakdown voltage, and improvement of a gate-drain breakdown voltage is indispensable for increasing the output power of devices.

However, there is a typical trade-off relationship between high output power of GaN HEMT and improvement of a source-drain breakdown voltage. In order to increase the concentration of 2DEG as transit carriers to achieve high output power by reducing contact resistance or access resistance, changing of a thickness or a composition ratio of the electron supply layer may be considered. However, when the thickness or the Al content of the electron supply layer of AlGaN in AlGaN/GaN HEMT is increased, dielectric breakdown may be likely to occur due to electric field concentration at the gate electrode end. When the thickness or the Al content of the electron supply layer of AlGaN is reduced in order to acquire sufficient gate-drain breakdown voltage, it may be difficult to acquire 2DEG concentration that satisfies desired output characteristics.

In order to overcome such difficulties, a technique for locally differentiating a film thickness or the Al content of the electron supply layer of AlGaN in-plane may be considered to achieve both high output power and improved breakdown voltage. However, in this case, lattice mismatch becomes conspicuous in a thick portion of the electron supply layer or in a high Al content portion of the electron supply layer at an interface between the electron supply layer and the electron transit layer located beneath the electron supply layer.

The present invention may provide a highly reliable compound semiconductor device and a method of fabricating such a compound semiconductor device capable of relaxing lattice mismatch between an electron transit layer and an electron supply layer as well as sufficiently achieving both high output power and improved breakdown voltage.

FIRST EMBODIMENT

In the following embodiments, a nitride semiconductor, AlGaN/GaN HEMT is disclosed as a compound semiconductor device. FIGS. 1A to 3 are schematic cross-sectional views illustrating a method of fabricating an AlGaN/GaN HEMT according to a first embodiment in a sequential order of steps. Note that the thickness of each layer constituting an AlGaN/GaN HEMT is not illustrated for accuracy.

Figure 1A:
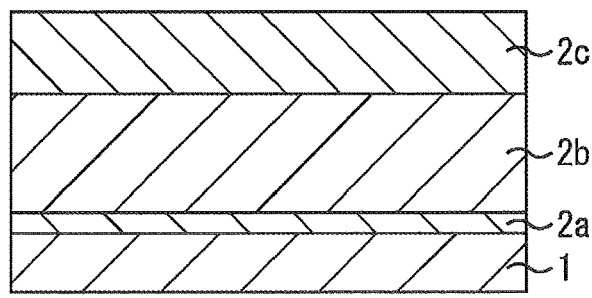
FIGS. 1A, 1B, and 1C are schematic cross-sectional views illustrating a method of fabricating an AlGaN/GaN HEMT according to a first embodiment in a sequential order of steps.
Figure 1B:
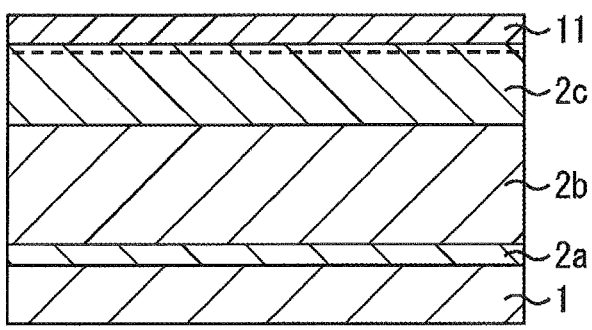
Figure 1C:
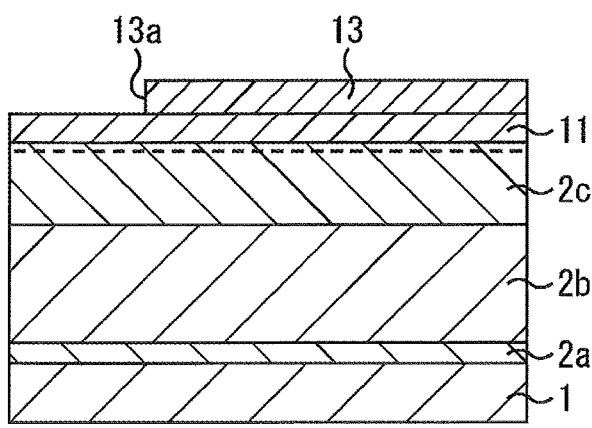

First, as illustrated in FIGS. 1A to 1C, a compound semiconductor multilayer structure 2 is formed on a Si substrate 1, for example, as a growth substrate. As a growth substrate, a SiC substrate, a sapphire substrate, a GaAs substrate, a GaN substrate, a ZnO substrate, or the like may be used instead of a Si substrate. The conductivity of a substrate may be semi-insulating or conductive. The compound semiconductor multilayer structure 2 includes an initial layer 2a, a buffer layer 2b, an electron transit layer 2c, and an electron supply layer 2d. A thin spacer layer of AlN, AlGaN or the like may be disposed between the electron transit layer 2c and the electron supply layer 2d (see FIGS. 2A to 2C). A cap layer of n-type GaN may be disposed on the electron supply layer 2d.

In the completed AlGaN/GaN HEMT, a two-dimensional electron gas (2DEG) is generated in the vicinity of an interface between the electron supply layer 2d of the electron transit layer 2c during its operation. This 2DEG is generated based on a difference in the lattice constant between a compound semiconductor (GaN, in this example) of the electron transit layer 2c and a compound semiconductor (AlGaN, in this example) of the electron supply layer 2d.

Specifically, the following compound semiconductors are grown on the Si substrate 1 by, for example, a metal organic vapor phase epitaxy (MOVPE) method. Instead of the MOVPE method, a molecular beam epitaxy (MBE:Molecular Beam Epitaxy) method or the like may be used.

As illustrated in FIG. 1A, GaN, AlN, AlGaN, etc. may be grown to a thickness of approximately several nm to several hundred nm on the Si substrate 1. For example, AlN may be grown to a thickness of approximately 20 nm on the Si substrate 1. As a result, an initial layer 2a is formed. The initial layer 2a is a so-called nucleation layer, and growth conditions such as growth temperature, growth pressure, a raw material supply ratio (V/III ratio), and film thickness are set such that the electron transit layer of GaN formed on the initial layer 2a has high crystallinity (low dislocation/low defect density).

Next, GaN is, for example, grown to a thickness of approximately several hundred nm, e.g., approximately 200 nm on the initial layer 2a. Continuously, GaN is, for example, grown to a thickness of approximately several hundred nm, e.g., approximately 300 nm. The buffer layer 2b is formed as a result. Note that a p-type (acceptor) impurity such as Fe may be doped during the growth of the lower layer GaN. Doping of the p-type impurity prevents current leakage, that is, so-called off-leak, through the buffer layer 2b when the power supply is off. In growing GaN, in order to sufficiently acquire an intake amount of Fe, GaN may be formed under a condition of a smaller intake amount of competitive C, which is, for example, at a high temperature of approximately 1100° C. The doping concentration (peak concentration) of Fe is set to approximately $1 \times 10^{16}$ atoms/cm$^3$ to $1 \times 10^{18}$ atoms/cm$^3$, which carries out compensation of residual donor impurities in the film. For example, the doping concentration of Fe may be set to approximately $5 \times 10^{17}$ atoms/cm$^3$. The upper layer GaN grows under a condition such as a low V/III ratio so as to obtain sufficient flatness on the outermost surface.

Next, i(intentionally undoped)-GaN is grown to a thickness of, for example, approximately 200 nm on the buffer layer 2b. The electron transit layer 2c functioning as a channel layer is thus formed. Since high quality (low impurity concentration) is required for the electron transit layer 2c, it is desirable to set the growth pressure, the growth temperature, and the V/III ratio to be higher than those during the growth of each GaN in the buffer layer 2b.

Next, an electron supply layer 2d is formed on the electron transit layer 2c. First, as illustrated in FIG. 1B, a first AlGaN layer 11 is formed. Specifically, AlGaN is grown to a thickness of approximately several nm to 20 nm, e.g., approximately 10 nm on the electron transit layer 2c. The first AlGaN layer 11 is thus formed. In order to sufficiently lower 2DEG concentration under the gate electrode, the Al content of the first AlGaN layer 11 is set to a low value of 10% or less. When the Al content is 10%, the first AlGaN layer 11 is $Al_{0.1}Ga_{0.9}N$.

Next, as illustrated in FIG. 1C, a mask 13 is formed on the first AlGaN layer 11. Specifically, an insulating material such as SiN is deposited on an entire surface of the first AlGaN layer 11 by CVD or the like, which is then etched to form a mask 13 having an opening 13a exposing a portion where a second AlGaN layer is to be formed.

Figure 2A:
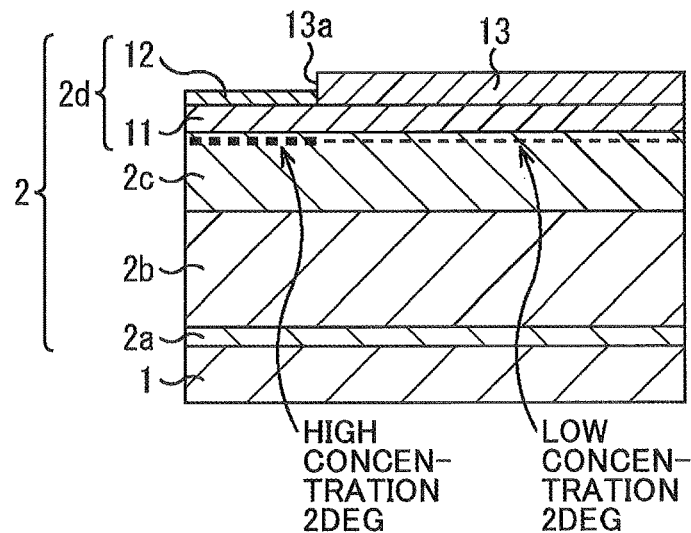
FIGS. 2A, 2B, and 2C are schematic cross-sectional views illustrating the method of fabricating an AlGaN/GaN HEMT according to the first embodiment in the sequential order of steps subsequent to the steps in FIGS. 1A, 1B, and 1C.

Next, as illustrated in FIG. 2A, a second AlGaN layer 12 is formed. Specifically, AlGaN is re-grown on a portion of the upper surface of the first AlGaN layer 11 exposed from the opening 13a by using the mask 13. As a result, the second AlGaN layer 12 is formed on the first AlGaN layer 11. An electron supply layer 2d is composed of the first AlGaN layer 11 and the second AlGaN layer 12.

The Al content of the second AlGaN layer 12 is higher than the Al content of the first AlGaN layer 11; for example, the Al content of the second AlGaN layer 12 is higher than 10% and lower than or equal to 100%. For example, when the Al content of the second AlGaN layer 12 is 80%, the second AlGaN layer 12 is $Al_{0.8}Ga_{0.1}N$. The mask 13 is removed by, for example, a wet process using an HF-based acid.

The thickness of the second AlGaN layer 12 may be ranged from approximately 2 nm or more, at which sufficient improvement of 2DEG concentration is expected, to approximately 30 nm, which is generally considered as an upper limit of the film thickness of AlGaN for the electron supply layer that is disposed on the electron transit layer of GaN. The thickness of the second AlGaN layer 12 is, for example, approximately 10 nm. The second AlGaN layer 12 is preferably thinner than the first AlGaN layer 11. By forming the second AlGaN layer 12 thinner than the first AlGaN layer 11, the electron transit layer 2c is separated from the second AlGaN layer 12 via the relatively thick first AlGaN layer 11. As a result, the lattice mismatch between the second AlGaN layer 12 and the electron transit layer 2c is relaxed, which may reduce an adverse effect, of the second AlGaN layer 12 containing a high-density defect due to its composition high in Al, on 2DEG.

In the present embodiment, the electron supply layer 2d includes distribution of the Al content of AlGaN formed in an in-plane direction and a film thickness direction of the electron supply layer 2d. In the electron supply layer 2d, the first AlGaN layer 11 forms a first region having a composition low in Al, and the second AlGaN layer 12 forms a second region having a composition high in Al. The second region has a bottom part (lower surface) covering the first region and has a portion where the source electrode is to be formed. The 2DEG generated in the vicinity of the interface with the electron supply layer 2d of the electron transit layer 2c has a low concentration in a portion aligned in a vertical direction with the first of the two regions. The 2DEG generated in the vicinity of the interface with the electron supply layer 2d of the electron transit layer 2c has a higher concentration in a portion aligned in a vertical direction with the second region than that of the portion aligned with the first of the two regions. In the figures, the former part of 2DEG is referred to as "low concentration 2DEG", and the latter part is referred to as "high concentration 2DEG".

As a growth condition of AlN, a mixed gas of trimethylaluminum (TMA) gas and ammonia (NH$_3$) gas is used as a raw material gas. As a growth condition of GaN, a mixed gas of trimethyl gallium (TMG) gas and NH$_3$ gas is used as a raw material gas. As a growth condition of AlGaN, a mixed gas of TMGA gas and NH$_3$ gas is used as a raw material gas. When GaN or the like is grown while Fe is doped, ferrocene (Cp$_2$F) is used. According to the compound semiconductor layer to be grown, whether to supply TMA gas as an Al source or TMG gas as a Ga source, and the flow rate of the gas may be appropriately set. The flow rate of the NH$_3$ gas used as a common raw material is set to approximately 100 ccm to 10 LM. Further, the growth pressure is set to approximately 50 Torr to 300 Torr, and the growth temperature is set to approximately 1000° C. to 1200° C. All the raw materials are supplied to the MOVPE reaction furnace by a carrier gas the flow rate of which is controlled by the mass flow controller (MFC).

Figure 2B:
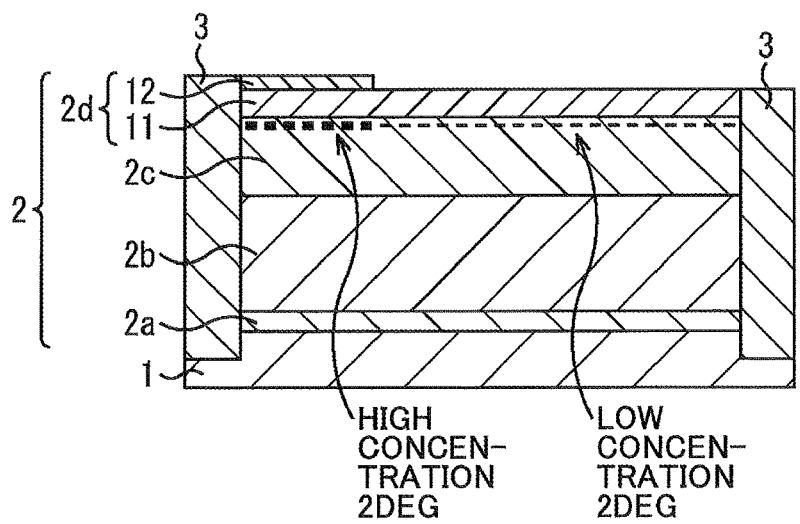

Next, as illustrated in FIG. 2B, a device isolation structure 3 is formed. Note that the illustration of the device isolation structure 3 is omitted from FIG. 2C and the subsequent figures. Specifically, for example, argon (Ar) is implanted into a device isolation region of the compound semiconductor multilayer structure 2. The device isolation structure 3 is thus formed in surface layer portions of the compound semiconductor multilayer structure 2 and the Si substrate 1. An active region is defined by the device isolation structures 3 on the compound semiconductor multilayer structure 2. Note that the device isolation may be performed by, for example, an STI (Shallow Trench Isolation) method instead of the above implantation method. In this case, a chlorine-based etching gas is used for dry etching of the compound semiconductor multilayer structure 2, for example.

Figure 2C:
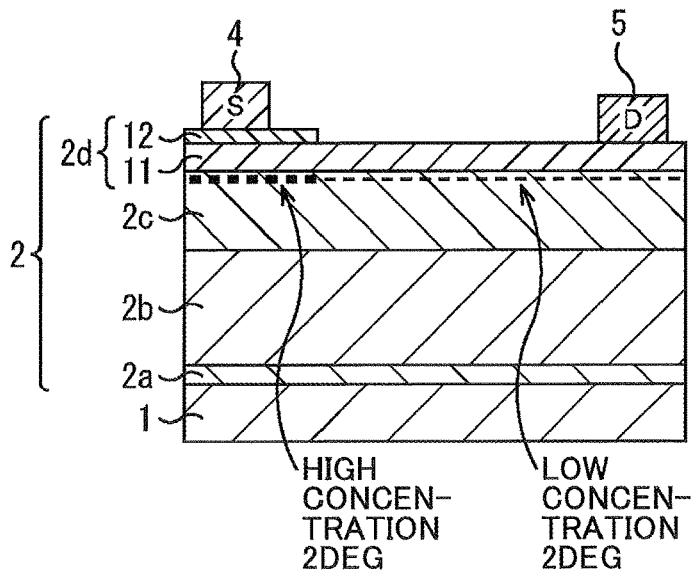

Subsequently, as illustrated in FIG. 2C, a source electrode 4 and a drain electrode 5 are formed. Specifically, a resist mask for forming a source electrode and a drain electrode is initially formed. In this example, an eaves structured two-layer resist suitable for a vapor deposition method and a lift off method is used. This resist is coated on the compound semiconductor multilayer structure 2 to form an opening for exposing a portion to be formed. The resist mask having the opening is thus formed.

For example, Ti/Al (Ti is a lower layer, Al is an upper layer) is deposited as an electrode material on the resist mask having an opening that exposes the portion to be formed by vapor deposition using this resist mask. The thickness of Ti is approximately 20 nm and the thickness of Al is approximately 200 nm. The resist mask and the Ti/Al deposited on the resist mask are removed by the lift-off method. Thereafter, the Si substrate 1 is heated in a nitrogen atmosphere at a temperature range of approximately 400° C. to 1000° C., e.g., at a temperature of approximately 600° C., and the remaining Ti/Al is brought into ohmic contact with the electron supply layer 2d. Heat treatment may be unnecessary insofar as ohmic contact with the Ti/Al electron supply layer 2d is obtained. Thus, the source electrode 4 and the drain electrode 5 are formed on the electron supply layer 2d.

In the present embodiment, with respect to the upper surface of the electron supply layer 2d, the source electrode 4 is disposed on the second AlGaN layer 12 which is the second region, and the drain electrode 5 is disposed on the first AlGaN layer 11 which is the first region. Since the source electrode 4 is disposed on the second AlGaN layer 12 having a composition high in Al, the contact resistance of the source electrode 4 is reduced.

Figure 3:
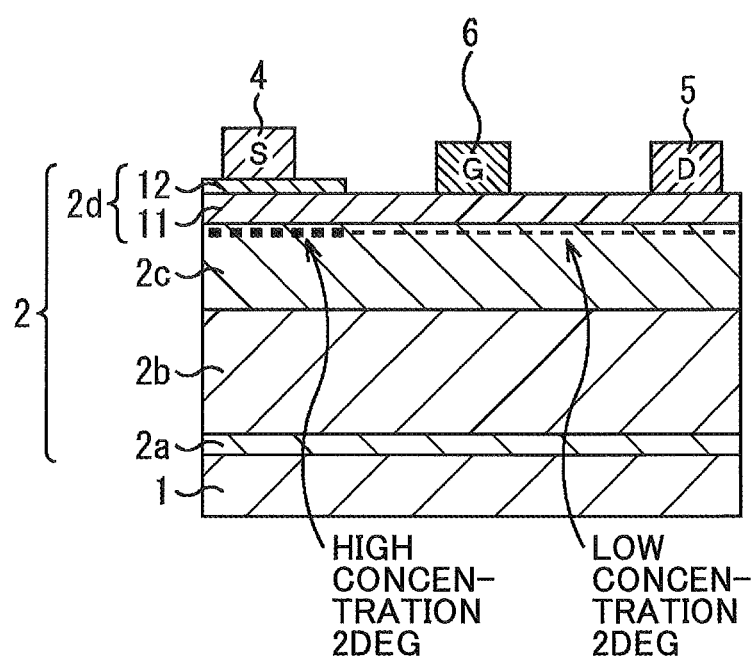
FIG. 3 is a schematic cross-sectional view illustrating the method of fabricating an AlGaN/GaN HEMT according to the first embodiment in the sequential order of steps subsequent to the steps in FIGS. 2A, 2B, and 2C.

Next, as illustrated in FIG. 3, a gate electrode 6 is formed. Specifically, a resist mask for forming a gate electrode is initially formed. In this example, two-layer resist suitable for a vapor deposition method and a lift off method is used. A resist is coated on the compound semiconductor multilayer structure 2 and processed by photolithography to form an opening exposing a portion of the electron supply layer 2d to be formed. This portion to be formed is located on the first AlGaN layer 11 which is the first region on an upper surface of the electron supply layer 2d. The resist mask having the opening is thus formed.

For example, Ni/Au (Ni is a lower layer, Au is an upper layer) is deposited as an electrode material on the resist mask having an opening that exposes the portion to be formed by vapor deposition using this resist mask. The thickness of Ni is approximately 30 nm and the thickness of Au is approximately 400 nm. The resist mask and the Ni/Au deposited on the resist mask are removed by the lift-off method. Thus, with respect to the upper surface of the electron supply layer 2d, the gate electrode 6 is formed on the first AlGaN layer 11 which is the first region.

Note that an end of the second AlGaN layer 12 that faces the gate electrode 6 in cross-sectional view is extended toward the gate electrode 6 with respect to an end of the source electrode 4 that faces the gate electrode 6. This configuration reduces the access resistance, which will be advantageous for higher output power. Note that the end of the second AlGaN layer 12 that faces the gate electrode 6 in cross-sectional view may be formed to be aligned flush with the end of the source electrode 4 that faces the gate electrode 6.

After various steps such as formation of an interlayer insulating film, formation of wiring connected to the source electrode 4, the drain electrode 5 and the gate electrode 6, formation of a protective film in the upper layer, formation of connection electrodes exposed on the outermost surface, a Schottky-type AlGaN/GaN HEMT according to the present embodiment is formed.

Figure 4:
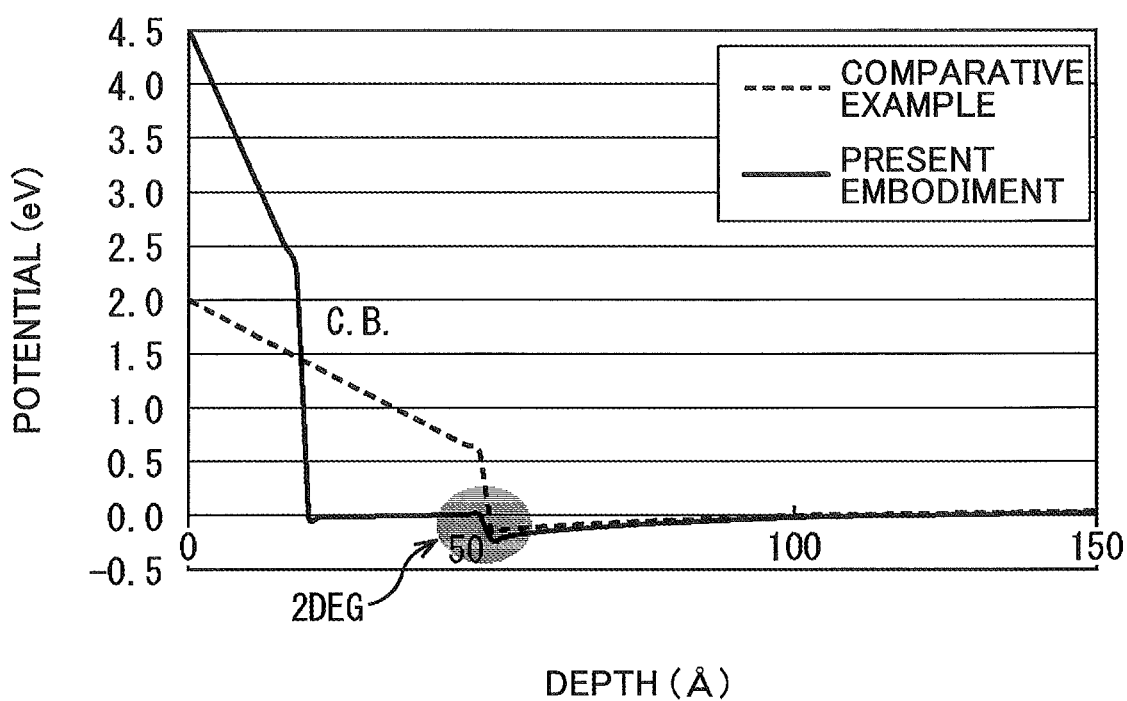
FIG. 4 is a characteristic graph illustrating a relationship between potential and a position in a depth direction (the upper surface of the electron supply layer is taken as 0) in the AlGaN/GaN HEMT according to the first embodiment and in AlGaN/GaN HEMT according to a comparative example.

The following illustrates concentration of 2DEG obtained by the AlGaN/GaN HEMT according to this embodiment based on a comparison with a comparative example. FIG. 4 is a characteristic graph illustrating a relationship between potential and a position in a depth direction (the upper surface of the electron supply layer taken as 0) in the AlGaN/GaN HEMT according to the first embodiment and AlGaN/GaN HEMT according to a comparative example. In the AlGaN/GaN HEMT of Comparative Example 1, the electron supply layer of AlGaN is a single layer having a composition of Al similar to that of the first AlGaN layer 11 of the present embodiment, and the other structures are the same as those of the present embodiment.

In the AlGaN/GaN HEMI according to the present embodiment, the electron supply layer has a second region having a composition high in Al, that is, a large band gap at the upper part of the electron supply layer, and a concentration of 2DEG higher than that of the comparative example may thus be obtained by the band offset effect. Specifically, in the comparative example, 2DEG sheet concentration is approximately $2.1 \times 10^{12}/cm^2$, whereas in the present embodiment, 2DEG sheet concentration is approximately $5.8 \times 10^{12}/cm^2$. Thus, 2DEG concentration obtained in the present embodiment may be 3 times higher than in the comparative example.

In the present embodiment, the electron supply layer 2d formed on the electron transit layer 2c includes a first region composed of the first compound semiconductor layer 11 and a second region having a bottom part (lower surface) covering the first region and composed of the second compound semiconductor layer 12 having a composition higher in Al than the first region. The gate electrode 6 is disposed on the first region, and the source electrode 4 is disposed on the second region. By adopting this structure, it is possible to acquire both high output power and improved source-drain breakdown voltage. The electron transit layer 2c and the second region having a composition high in Al are separated via the first region having a composition low in Al, and the lattice mismatch between the electron transit layer 2c and the electron supply layer 2d is relaxed. Thus, an adverse effect, of the second region containing a high dislocation density, on 2DEG is reduced and electron collapse is reduced.

MODIFICATIONS

The following illustrates an AlGaN/GaN HEMT according to various modifications of the first embodiment. The same constituent members as those of the AlGaN/GaN HEMT according to the first embodiment are denoted by the same reference numerals, and a detailed description thereof will be omitted.

FIRST MODIFICATION

Figure 6:
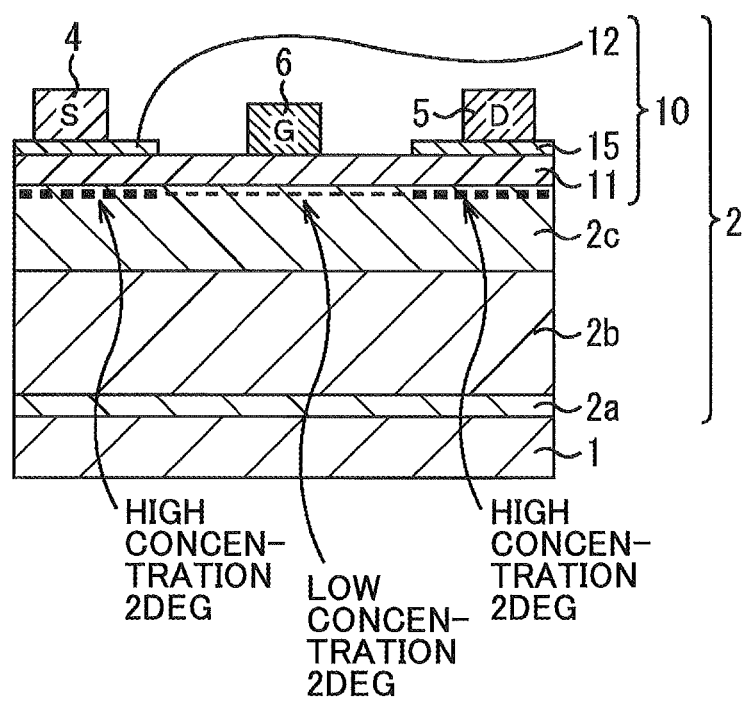
FIG. 6 is a schematic cross-sectional view illustrating another main step in the method of fabricating an AlGaN/GaN HEMT according to the first modification of the first embodiment subsequent to the steps in FIGS. 5A, 5B, and 5C.

The first modification differs from the first embodiment in that a third region having a composition high in Al is formed below the drain electrode in the electron supply layer of the AlGaN/GaN HEMT in a manner similar to the second region. FIGS. 5A to 6 are schematic cross-sectional views illustrating main steps in the method of fabricating an AlGaN/GaN HEMT according to first modification of the first embodiment.

First, as with the first embodiment, the first AlGaN layer 11 having a composition low in Al is formed on the electron transit layer 2c by performing the steps illustrated in FIGS. 1A to 1B. FIG. 5A depicts the outcome of the steps.

Subsequently, as illustrated in FIG. 5B, a second AlGaN layer 12 and a third AlGaN layer 15 having a composition high in Al are formed on the first AlGaN layer 11. Specifically, an insulating material such as SiN is deposited on an entire surface of the first AlGaN layer 11 by CVD or the like, which is then etched to form a mask 14 having openings 14a and 14b exposing respective portions where the second AlGaN layer and the third AlGaN layer are to be formed. Using the mask 14, AlGaN is re-grown on portions exposed from the openings 14a and 14b of the upper surface of the first AlGaN layer 11 to form the second AlGaN layer and the third AlGaN layer 15. An electron supply layer 10 is composed of the first AlGaN layer 11, the second AlGaN layer 12, and the third AlGaN layer 15. The compositions of the second AlGaN layer 12 and the third AlGaN layer 15 are higher in Al than the first AlGaN layer 11. For example, the Al content of each of the second AlGaN layer 12 and the third AlGaN layer 15 are higher than 10% and lower than or equal to 100%. For example, when the Al content of each of the second AlGaN layer 12 and the third AlGaN layer 15 are 80%, the second AlGaN layer and the third AlGaN layer 15 are each $Al_{0.8}Ga_{0.1}N$. The mask 14 is removed by, for example, a wet process using an HF-based acid.

The thicknesses of the second AlGaN layer 12 and the third AlGaN layer 15 may be ranged from approximately 2 nm or more, at which sufficient improvement of 2DEG concentration is expected, to approximately 30 nm, which is generally considered as the upper limit of the film thickness of AlGaN for the electron supply layer on the electron transit layer of GaN. The thicknesses of the second AlGaN layer 12 and the third AlGaN layer 15 are, for example, approximately 10 nm. The second AlGaN layer 12 and the third AlGaN layer 15 are preferably thinner than the first AlGaN layer 11. By forming the second AlGaN layer 12 and the third AlGaN layer 15 thinner than the first AlGaN layer 11, the electron transit layer 2c is separated from the second and third AlGaN layers 12 and 15 via the relatively thick first AlGaN layer 11. As a result, the lattice mismatch between the second and third AlGaN layers 12 and 15 and the electron transit layer 2c is relaxed, which may reduce an adverse effect, of the second and third regions containing high-density defects due to their compositions high in Al, on 2DEG and may reduce electron collapse.

In the first modification, the electron supply layer 10 includes a distribution of Al in AlGaN in an in-plane direction and film thickness direction of the electron supply layer 10. In the electron supply layer 10, the first AlGaN layer 11 forms a first region having a composition low in Al, the second AlGaN layer forms a second region having a composition high in Al, and the third AlGaN layer 15 forms a third region having a composition high in Al. The second region has a bottom part (lower surface) covering the first region and has a portion where a source electrode is to be formed. The third region has a bottom part (lower surface) covering the first region and has a portion where a drain electrode is to be formed. The 2DEG generated in the vicinity of the interface with the electron supply layer 10 of the electron transit layer 2c has a low concentration in a portion aligned in a vertical direction with the first of the two regions. The 2DEG generated in the vicinity of the interface with the electron supply layer 10 of the electron transit layer 2c has a higher concentration than in a portion aligned in a vertical direction with the second region than that of the portion aligned with the first of the two regions. In the figures, the former part of 2DEG is referred to as "low concentration 2DEG", and the latter part as "high concentration 2DEG".

Subsequently, the device isolation structure 3 is formed as in the case of FIG. 2B, and then the source electrode 4 and the drain electrode 5 are formed as illustrated in FIG. 5C. In the first modification, with respect to the upper surface of the electron supply layer 10, the source electrode 4 is disposed on the second AlGaN layer 12 which is the second region, and the drain electrode 5 is disposed on the third AlGaN layer 15 as the third region. Since the source electrode 4 is disposed on the second AlGaN layer 12 having a composition high in Al, and the drain electrode 5 is disposed on the third AlGaN layer 15 having a composition high in Al, the contact resistance of the source electrode 4 and the drain electrode 5 is reduced.

Subsequently, as with FIG. 3, as illustrated in FIG. 6, the gate electrode 6 is formed on the first AlGaN layer 11 which is the first region. Note that an end of the second AlGaN layer 12 that faces the gate electrode 6 in cross-sectional view is extended toward the gate electrode 6 with respect to an end of the source electrode 4 that faces the gate electrode 6. Likewise, an end of the third AlGaN layer 15 that faces the gate electrode 6 in cross-sectional view is extended toward the gate electrode 6 from an end of the drain electrode 5 that faces the gate electrode 6. These configurations reduce the access resistance, which will be advantageous for higher output power.

Note that the end of the second AlGaN layer 12 that faces the gate electrode 6 in cross-sectional view may be formed to be aligned flush with the end of the source electrode 4 that faces the gate electrode 6. Similarly, the end of the third AlGaN layer 15 that faces the gate electrode 6 in cross-sectional view may be formed to be aligned flush with the end of the drain electrode 5 that faces the gate electrode 6.

After various steps such as formation of an interlayer insulating film, formation of wiring connected to the source electrode 4, the drain electrode 5 and the gate electrode 6, formation of a protective film in the upper layer, and formation of connection electrodes exposed on the outermost surface, a Schottky-type AlGaN/GaN HEMI according to the first modification is formed.

In the first modification, the electron supply layer 10 formed on the electron transit layer 2c includes a first region composed of the first compound semiconductor layer 11, and second and third regions having respective bottom parts (respective lower surfaces) covering the first region and respectively composed of the second compound semiconductor layer 12 and the third compound semiconductor layer 15 each having a composition higher in Al than the first region. The gate electrode 6 is disposed on the first region, the source electrode 4 is disposed on the second region, and the drain electrode 5 is disposed on the third region. By adopting this structure, it is possible to acquire both high output power and improved source-drain breakdown voltage. The electron transit layer 2c and the second and third regions having a composition high in Al are separated via the first region having a composition low in Al, and the lattice mismatch between the electron transit layer 2c and the electron supply layer 10 is relaxed. Thus, an adverse effect, of the second AlGaN layer 12 and the third AlGaN layer 15 containing a high dislocation density, on 2DEG is reduced and electron collapse is reduced.

SECOND MODIFICATION

Figure 7A:
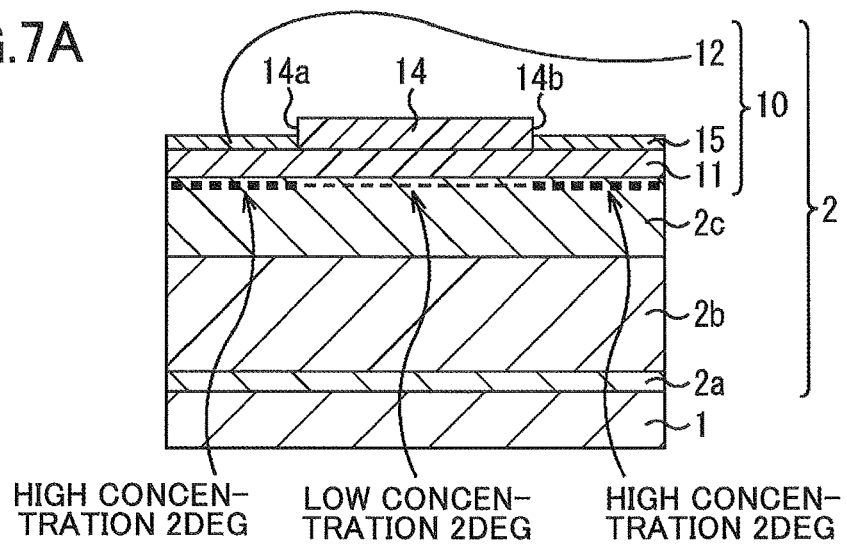
FIGS. 7A, 7B, and 7C are schematic cross-sectional views illustrating main steps in a method of fabricating an AlGaN/GaN HEMT according to second modification of the first embodiment.
Figure 7B:
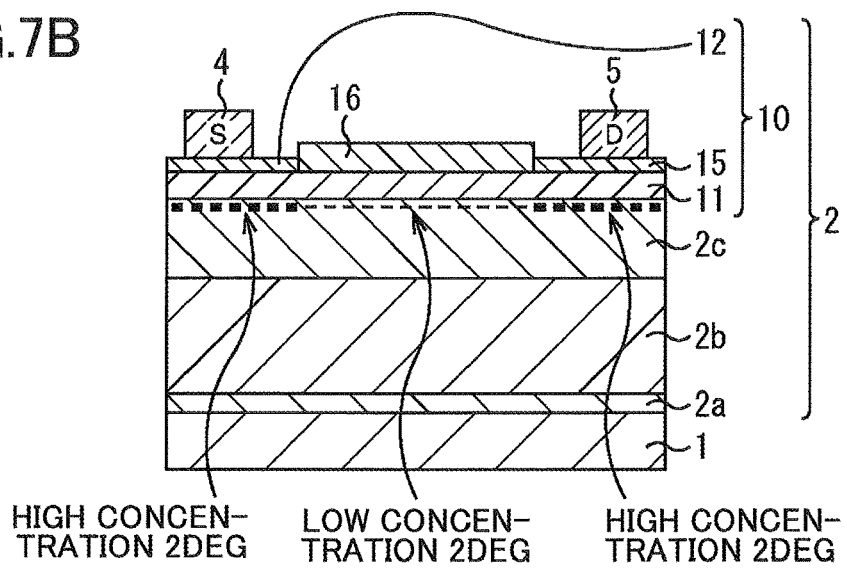
Figure 7C:
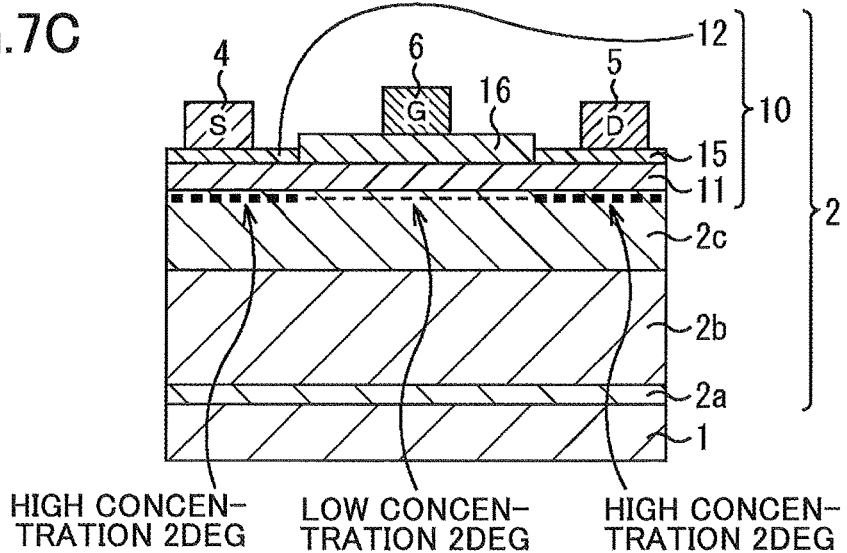

In the second modification, a MIS (Metal Insulator Semiconductor)-type AlGaN/GaN HEMT having the configuration of the first modification is disclosed. FIGS. 7A, 7B, and 7C are schematic cross-sectional views illustrating main steps in a method of fabricating an AlGaN/GaN HEMT according to second modification of the first embodiment.

First, as with the first modification, after performing the steps illustrated in FIGS. 1A and 1B, the second AlGaN layer 12 and the third AlGaN layer 15 are formed in a manner similar to FIG. 5B, and the electron supply layer 10 is thus formed. FIG. 7A depicts the outcome of the steps.

Subsequently, the device isolation structure 3 is formed as in the case of FIG. 2B, and then the source electrode 4 and the drain electrode 5 are formed as illustrated in FIG. 7B. In the first modification, with respect to the upper surface of the electron supply layer 10, the source electrode 4 is disposed on the second AlGaN layer 12 which is the second region, and the drain electrode 5 is disposed on the third AlGaN layer 15 as the third region. Since the source electrode 4 is disposed on the second AlGaN layer 12 having a composition high in Al and the drain electrode 5 is disposed on the third AlGaN layer 15 having a composition high in Al, the contact resistance of the source electrode 4 and the drain electrode 5 is reduced.

Next, as illustrated in FIG. 7C, a gate electrode 6 is formed. In the second modification, the mask 14 on the electron supply layer 10 that is not removed but is left is used as a gate insulating film. Hereinafter, the mask 14 is referred to as a gate insulating film 16. The gate electrode 6 is formed on the gate insulating film 16 by the same method as in the first embodiment.

After various steps such as formation of an interlayer insulating film, formation of wiring connected to the source electrode 4, the drain electrode 5 and the gate electrode 6, formation of a protective film in the upper layer, and formation of connection electrodes exposed on the outermost surface, a MIS-type AlGaN/GaN HEMT according to the second modification is formed.

In the second modification, in addition to the effects described in the first modification, gate leakage current is reduced by using the MIS-type AlGaN/GaN HEMT, and reliable normally-off may be achieved.

SECOND EMBODIMENT

In the second embodiment, an AlGaN/GaN HEMI is disclosed in a manner similar to the first embodiment, however, the second embodiment differs from the first embodiment in that the method and structure of the electron supply layer are slightly different. FIGS. 8A to 9B are schematic cross-sectional views illustrating main steps in a method of fabricating an AlGaN/GaN-HEMT according to the second embodiment. The same constituent members as those of the AlGaN/GaN HEMI according to the first embodiment are denoted by the same reference numerals, and a detailed description thereof will be omitted.

Figure 8A:
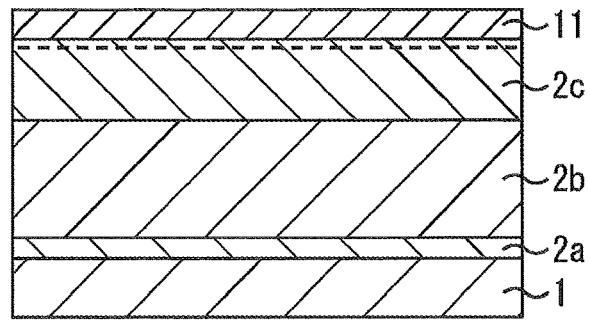
FIGS. 8A, 8B, and 8C are schematic cross-sectional views illustrating main steps in a method of fabricating an AlGaN/GaN HEMT according to a second embodiment.

First, as with the first embodiment, the first AlGaN layer 11 having a composition low in Al is formed on the electron transit layer 2c by performing the steps illustrated in FIGS. 1A to 1B. FIG. 8A depicts the outcome of the steps.

Figure 8B:
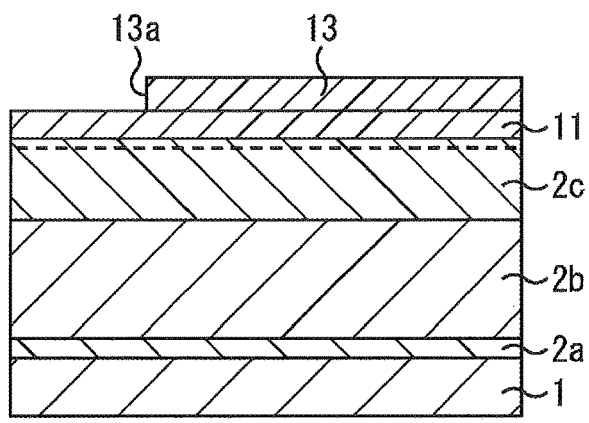

Next, as illustrated in FIG. 8B, a mask is formed on the first AlGaN layer 11. Specifically, an insulating material such as SiN is deposited on an entire surface of the first AlGaN layer 11 by CVD or the like, which is then etched to form a mask 13 having an opening 13a exposing a portion where a second AlGaN layer is to be formed.

Figure 8C:
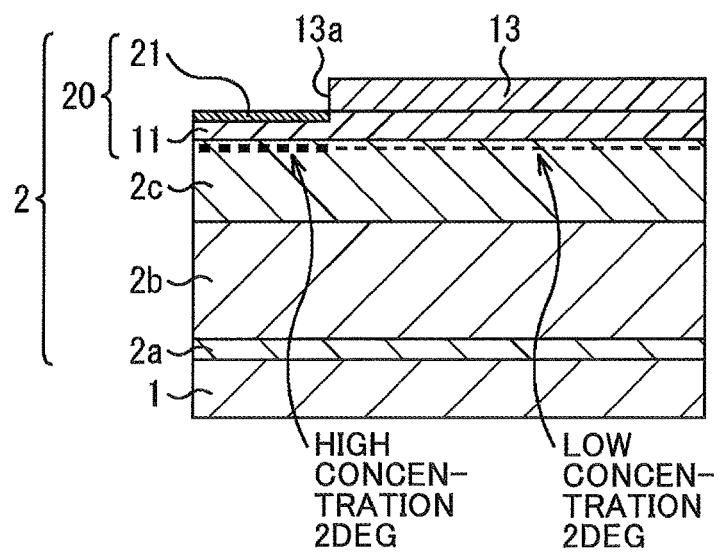

Next, as illustrated in FIG. 8C, a second AlGaN layer 21 is formed. Specifically, the Si substrate 1 is transferred into, for example, an MOCVD furnace, the atmospheric gas is set to, for example, $H_2$ and $NH_3$, and the heating is performed at a temperature close to the growth temperature of the first AlGaN layer 11, e.g., approximately 1000° C. As a result, Ga is desorbed from the vicinity of the outermost surface of the portion of the first AlGaN layer 11 exposed from the opening 13a of the mask 13. In the vicinity of the outermost surface of the exposed portion of the first AlGaN layer 11, the Al content is relatively increased due to Ga desorption, and a second AlGaN layer 21 having a composition higher in Al than the first AlGaN layer 11 is thus formed. An electron supply layer 20 composed of the first AlGaN layer 11 and the second AlGaN layer 21 having a bottom part and side part (lower surface and side surface) covering the first AlGaN layer 11 is thus formed.

The composition of the second AlGaN layer 21 is higher in Al than the first AlGaN layer 11. For example, the Al content of the second AlGaN layer 21 is higher than 10% and lower than or equal to 100%. For example, when the Al content of the second AlGaN layer 21 is 80%, the second AlGaN layer 21 is $Al_{0.8}Ga_{0.1}N$. The mask 13 is removed by, for example, a wet process using an HF-based acid.

The thickness of the second AlGaN layer 21 is set to approximately 2 nm or more, which is expected to improve the sufficient 2DEG concentration; for example, the thickness of the second AlGaN layer 21 may be set to the extent that the first AlGaN layer 11 remains at the intended thickness of, for example, approximately 4 nm. The second AlGaN layer 21 is preferably thinner than the first AlGaN layer 11, which is a lower layer of the second AlGaN layer 21. By forming the second AlGaN layer 21 thinner than the first AlGaN layer 11 located beneath the second AlGaN layer 21, the electron transit layer 2c is separated from the second AlGaN layer 21 via the relatively thick first AlGaN layer 11. As a result, the lattice mismatch between the second AlGaN layer 21 and the electron transit layer 2c is relaxed, which may reduce an adverse effect, of the second AlGaN layer 21 containing a high-density defect due to its composition high in Al, on 2DEG, and may reduce electron collapse.

In the second embodiment, the electron supply layer 20 includes a distribution of Al in AlGaN in the in-plane direction and film thickness direction of the electron supply layer 20. In the electron supply layer 20, the first AlGaN layer 11 forms a first region having a composition low in Al and the second AlGaN layer forms a second region having a composition high in Al. The second region has a bottom part (lower surface) covering the first region and has a portion where the source electrode is to be formed. The 2DEG generated in the vicinity of the interface with the electron supply layer 20 of the electron transit layer 2c has a low concentration in a portion aligned in a vertical direction with the first of the two regions. The 2DEG generated in the vicinity of the interface with the electron supply layer 20 of the electron transit layer 2c has a higher concentration in a portion aligned in a vertical direction with the second region than that of the portion aligned with the first of the two regions. In the figures, the former part of 2DEG is referred to as "low concentration 2DEG", and the latter part is referred to as "high concentration 2DEG".

Figure 9A:
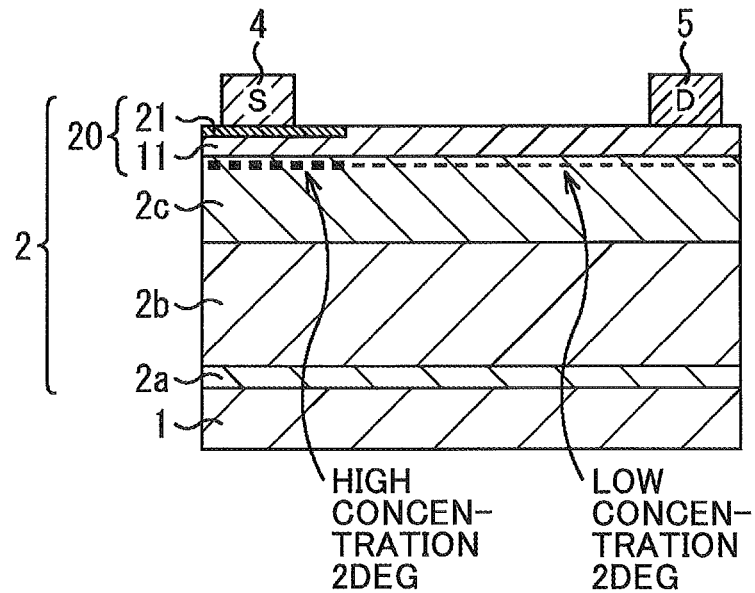
FIGS. 9A and 9B are schematic cross-sectional views illustrating other main steps in the method of fabricating an AlGaN/GaN HEMT according to the second embodiment subsequent to the steps in FIGS. 8A, 8B, and 8C.

Subsequently, the device isolation structure 3 is formed as in the case of FIG. 2B, and then the source electrode 4 and the drain electrode 5 are formed as illustrated in FIG. 9A. In the second embodiment, with respect to the upper surface of the electron supply layer 20, the source electrode 4 is disposed on the second AlGaN layer 21 which is the second region, and the drain electrode 5 is disposed on the first AlGaN layer 11 which is the first region. Since the source electrode 4 is disposed on the second AlGaN layer 21 having a composition high in Al, the contact resistance of the source electrode 4 is reduced.

Figure 9B:
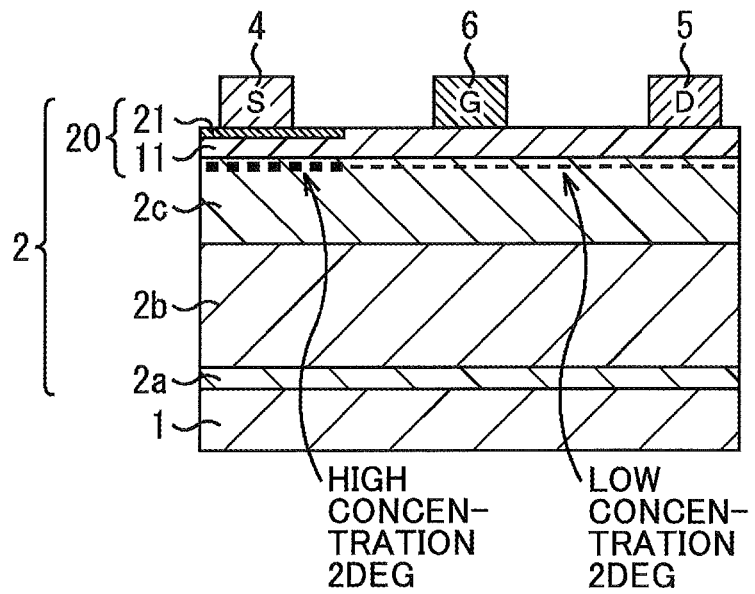

Subsequently, as with FIG. 3, as illustrated in FIG. 9B, the gate electrode 6 is formed on the first AlGaN layer 11 which is the first region. Note that an end of the second AlGaN layer 21 that faces the gate electrode 6 direction in cross-sectional view is extended toward the gate electrode 6 with respect to an end of the source electrode 4 that faces the gate electrode 6 direction. This configuration reduces the access resistance, which will be advantageous for higher output power.

Note that the end of the second AlGaN layer 21 that faces the gate electrode 6 in cross-sectional view may be formed to be aligned flush with the end of the source electrode 4 that faces the gate electrode 6.

After various steps such as formation of an interlayer insulating film, formation of wiring connected to the source electrode 4, the drain electrode 5 and the gate electrode 6, formation of a protective film in the upper layer, and formation of connection electrodes exposed on the outermost surface, a Schottky-type AlGaN/GaN HEMT according to the second embodiment is formed.

In the second embodiment, the electron supply layer 20 formed on the electron transit layer 2c includes a first region composed of the first compound semiconductor layer 11 and a second region having a bottom part and a side part (lower surface and side surface) covering the first region and composed of the second compound semiconductor layer 21 having a composition higher in Al than the first region. The gate electrode 6 is disposed on the first region, and the source electrode 4 is disposed on the second region. By adopting this structure, it is possible to acquire both high output power and improved source-drain breakdown voltage. The electron transit layer 2c and the second region having a composition high in Al are separated via the first region having a composition low in Al, and the lattice mismatch between the electron transit layer 2c and the electron supply layer 20 is relaxed. Thus, an adverse effect, of the second region containing a high dislocation density, on 2DEG is reduced and electron collapse is reduced.

THIRD EMBODIMENT

In the third embodiment, an AlGaN/GaN HEMT is disclosed in a manner similar to the first embodiment, however, the third embodiment differs from the first embodiment in that the method and structure of the electron supply layer are slightly different. FIGS. 10A to 11B are schematic cross-sectional views illustrating main steps in a method of fabricating an AlGaN/GaN-HEMT according to the third embodiment. The same constituent members as those of the AlGaN/GaN HEMT according to the first embodiment are denoted by the same reference numerals, and a detailed description thereof will be omitted.

Figure 10A:
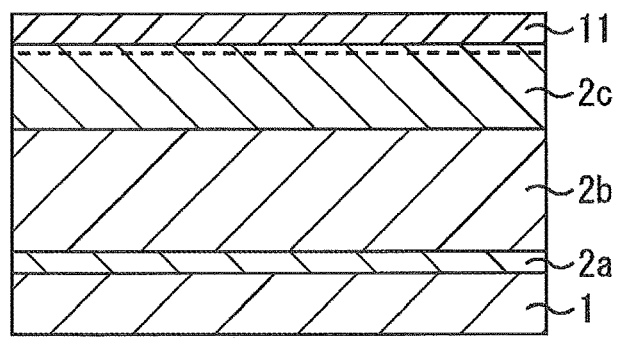
FIGS. 10A, 10B, and 10C are schematic cross-sectional views illustrating main steps in a method of fabricating an AlGaN/GaN HEMT according to a third embodiment.

First, as with the first embodiment, the first AlGaN layer 11 having a composition low in Al is formed on the electron transit layer 2c by performing the steps illustrated in FIGS. 1A to 1B. FIG. 10A depicts the outcome of the steps.

Figure 10B:
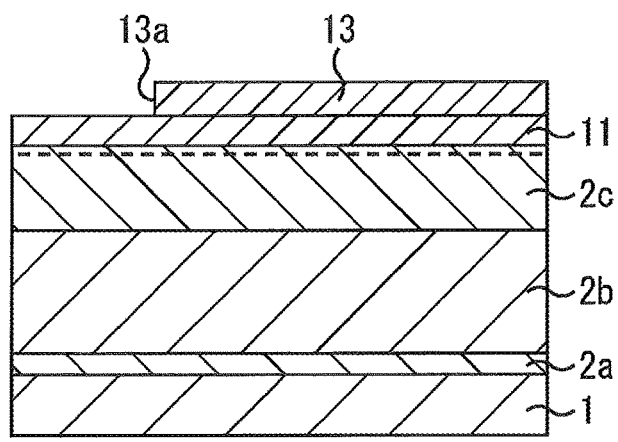

Next, as illustrated in FIG. 10B, a mask 13 is formed on the first AlGaN layer 11. Specifically, an insulating material such as SiN is deposited on the entire surface of the first AlGaN layer 11 by CVD or the like, which is then etched to form a mask 13 having an opening 13a exposing a portion where a second AlGaN layer is to be formed.

Figure 10C:
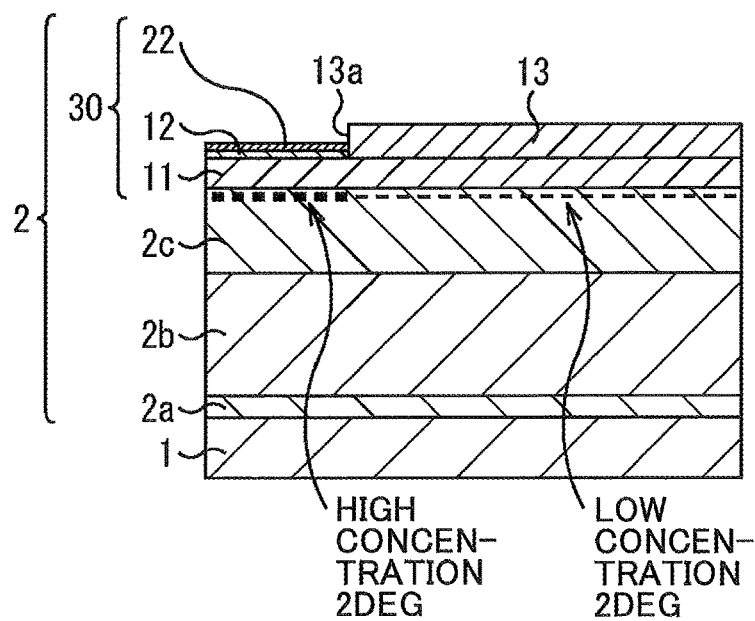

Subsequently, as illustrated in FIG. 10C, the second AlGaN layer 12 having a composition high in Al is formed and an n-doped layer 22 is formed at least in an upper portion of the second AlGaN layer 12.

Specifically, AlGaN is again grown on a portion exposed from the opening 13a of the upper surface of the first AlGaN layer 11 by using the mask 13. Note that AlGaN is doped with an n-type impurity such as Si or Ge. Specifically, monosilane ($SiH_4$) is added as a dopant of Si or monogermane ($GeH_4$) is added as a dopant of Ge to a mixed gas of TMA gas, TMG gas and $NH_3$ gas which are raw material gases of AlGaN.

Figure 12A:
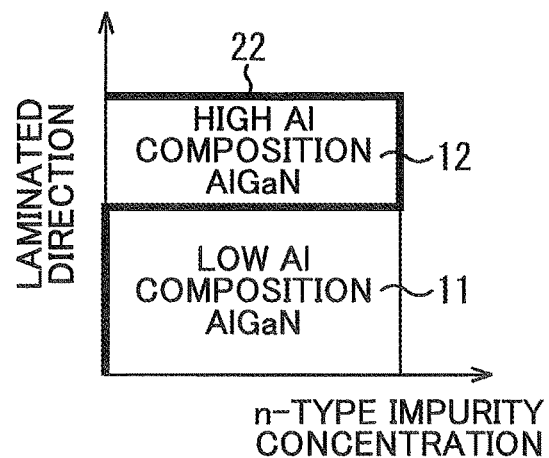
FIGS. 12A, 12B, and 12C are characteristic graphs illustrating various aspects of doping distribution of n-type impurities during growth of the second AlGaN layer in the third embodiment.
Figure 12B:
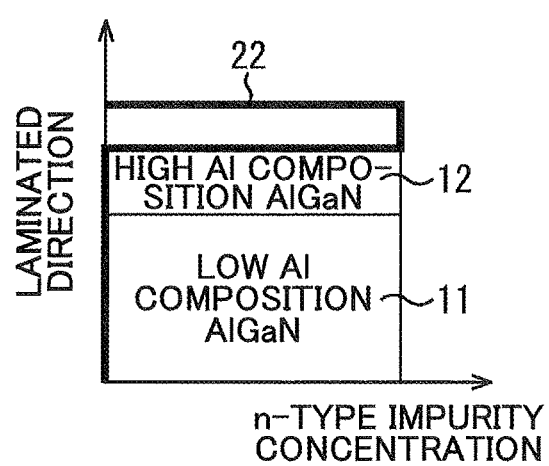
Figure 12C:
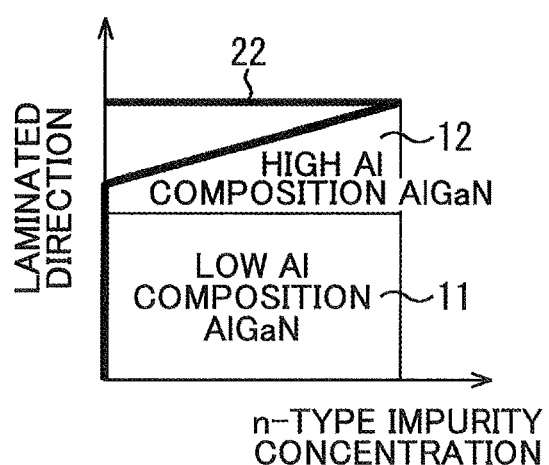

In the growth of the second AlGaN layer 12, doping distribution of n-type impurity has the following three types of distributions. FIGS. 12A, 12B, and 12C are characteristic graphs illustrating various types of doping distribution of n-type impurities during growth of the second AlGaN layer in the third embodiment.

FIG. 12A illustrates a first type distribution. The first type distribution is obtained by adding a dopant of an n-type impurity at a constant flow rate during a period between the start of growth to the end of growth of the second AlGaN layer 12. As a result, an n-doped layer 22 having a constant n-type impurity concentration is formed throughout the second AlGaN layer 12.

FIG. 12B illustrates a second type distribution. The second type distribution is obtained by adding a dopant of an n-type impurity at a constant flow rate during a period that begins following a predetermined time elapsed from the start of the growth of the second AlGaN layer 12 and that ends with the growth of the second AlGaN layer 12. As a result, an n-doped layer 22 having a constant n-type impurity concentration is formed only in the upper portion of the second AlGaN layer 12. FIG. 10C illustrates an example of this second type distribution.

FIG. 12C illustrates a third type distribution. The third type distribution is obtained by adding a dopant of an n-type impurity while gradually increased the flow rate during a period that begins following a predetermined time elapsed from the start of the growth of the second AlGaN layer 12 and that ends with the growth of the second AlGaN layer 12. As a result, an n-doped layer 22 having a gradually increased n-type impurity concentration is formed in the second AlGaN layer 12.

FIG. 13 is a schematic diagram illustrating a relationship between 2DEG concentration and current collapse (electric characteristic deterioration caused by carrier trapping due to crystal defects) in the respective distribution types (a), (b) and (c) illustrated in FIGS. 12A, 12B, and 12C. In the first distribution type (a) in FIG. 13, the highest 2DEG concentration among the three distribution types may be obtained. However, since the n-doped layer 22 containing crystal defects introduced by doping with n-type impurity is located closest to 2DEG, the collapse characteristics may be relatively inferior among the three distribution types.

In the third distribution type (c), the opposite result to the first distribution type (a) is obtained. That is, in the third distribution type (c), since the n-doped layer containing crystal defects introduced by doping with n-type impurity is located farthest from 2DEG, excellent collapse characteristics among the three distribution types may be obtained. However, the third distribution type (c) has a relatively low 2DEG concentration among the three distribution types.

In the second distribution type (b), an intermediate effect between those of the first distribution type and the third distribution type is obtained for both 2DEG concentration and the current collapse characteristics. In the third embodiment, it is possible to acquire desired characteristics by appropriately selecting the formation method of the doping distribution of the n-type impurity. As described above, an electron supply layer 30 includes the first AlGaN layer 11, the second AlGaN layer 12 having the bottom part (bottom surface) covering the first AlGaN layer 11, and an n-doped layer 22 formed in the second AlGaN layer 12.

Figure 11A:
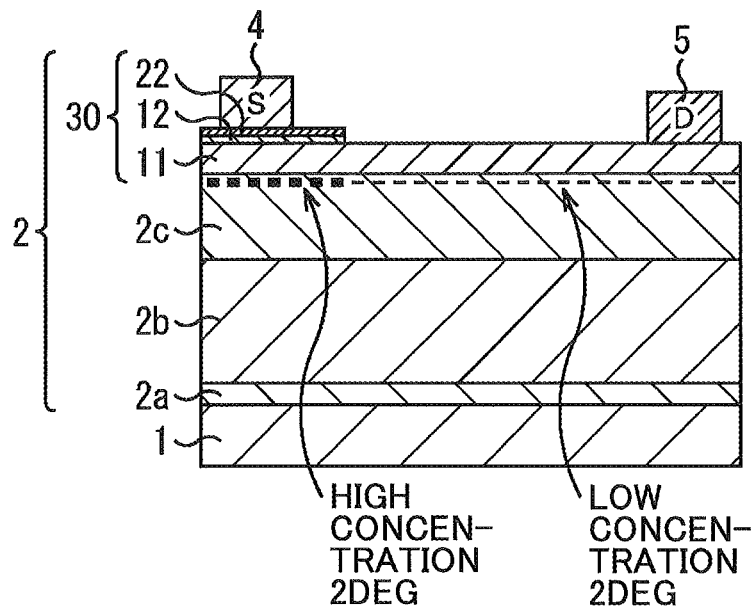
FIGS. 11A and 11B are schematic cross-sectional views illustrating other main steps in the method of fabricating an AlGaN/GaN HEMT according to the third embodiment subsequent to the steps in FIGS. 10A, 10B, and 10C.

Subsequently, the device isolation structure 3 is formed as in the case of FIG. 2B, and then the source electrode 4 and the drain electrode 5 are formed as illustrated in FIG. 11A. In the third embodiment, with respect to the upper surface of the electron supply layer 30, the source electrode 4 is disposed on the second AlGaN layer 12 which is the second region (strictly speaking, on the n-doped layer 22 via the second AlGaN layer 12), and the drain electrode 5 is disposed on the first AlGaN layer 11 which is the first region. Since the source electrode 4 is disposed on the second AlGaN layer 12 having a composition high in Al, the contact resistance of the source electrode 4 is reduced.

Figure 11B:
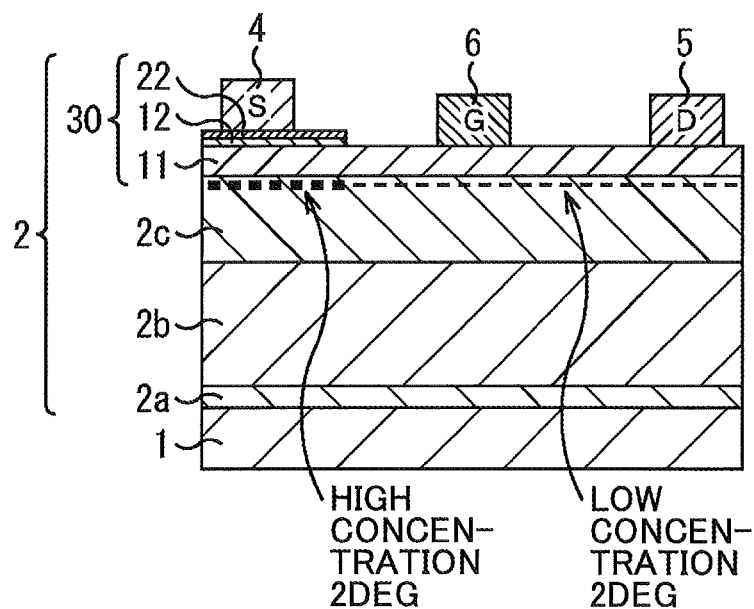

Subsequently, as with FIG. 3, as illustrated in FIG. 11B, the gate electrode 6 is formed on the first AlGaN layer 11 which is the first region. Note that an end of the second AlGaN layer 12 that faces the gate electrode 6 in cross-sectional view is extended toward the gate electrode 6 with respect to an end of the source electrode 4 that faces the gate electrode 6. This configuration reduces the access resistance, which will be advantageous for higher output power.

Note that the end of the second AlGaN layer 12 that faces the gate electrode 6 in cross-sectional view may be formed to be aligned flush with the end of the source electrode 4 that faces the gate electrode 6.

After various steps such as formation of an interlayer insulating film, formation of wiring connected to the source electrode 4, the drain electrode 5 and the gate electrode 6, formation of a protective film in the upper layer, and formation of connection electrodes exposed on the outermost surface, a Schottky-type AlGaN/GaNHEMT according to the third embodiment is formed.

In the third embodiment, the electron supply layer 30 formed on the electron transit layer 2c includes a first region composed of the first compound semiconductor layer 11 and a second region having a bottom part and a side part (lower surface and side surface) covering the first region and composed of the second compound semiconductor layer 12 having a composition higher in Al than the first region. The gate electrode 6 is disposed on the first region, and the source electrode 4 is disposed on the second region. By adopting this structure, it is possible to acquire both high output power and improved source-drain breakdown voltage. The electron transit layer 2c and the second region having a composition high in Al are separated via the first region having a composition low in Al, and the lattice mismatch between the electron transit layer 2c and the electron supply layer 30 is relaxed. Thus, an adverse effect, of the second region containing a high dislocation density, on 2DEG is reduced and electron collapse is reduced.

Furthermore, an n-doped layer 22 doped with an n-type impurity is formed at least in an upper portion of the second compound semiconductor layer 12. This n-doped layer 22 further improves 2DEG concentration.

Although the first to third embodiments and various modifications have been described above, the invention is not limited to these embodiments and modifications. Several other embodiments are given below. For example, in the second modification of the first embodiment, as with the first embodiment, the electron supply layer 10 is formed, the source electrode 4 and the drain electrode 5 are subsequently formed, and thereafter an insulating film is formed on the entire surface, which is patterned to forma gate insulating film. In this case, the gate insulating film is not limited to SiN, and various insulators may be used. For example, a gate insulating film may be formed by depositing oxide, nitride, oxynitride of Si, Al, Hf, Zr, Ti, Ta or W or may be formed by selecting and depositing some of those in multiple layers appropriately.

Further, in the second embodiment, when the second AlGaN layer 21 is formed by desorbing Ga in a portion of the first AlGaN layer 11 with heating, an n-doped layer may be formed in at least the upper portion of the second AlGaN layer, according to the third embodiment. In this case, an n-type impurity dopant is mixed into atmospheric gases ($H_2$, $NH_3$) to be introduced into the MOCVD furnace. The n-doped layer is formed into a doping distribution of n-type impurities as in the first to third type distributions of FIGS. 12A to 12C, for example.

Further, in the first modification of the first embodiment, for the electron supply layer 10, the third embodiment may be applied when forming the third region having a composition high in Al near the drain electrode together with the second region having a composition high in Al near the source electrode. In this case, an n-doped layer is formed at least in upper portions of the second AlGaN layer 12 and the third AlGaN layer 15.

FOURTH EMBODIMENT

Figure 14:
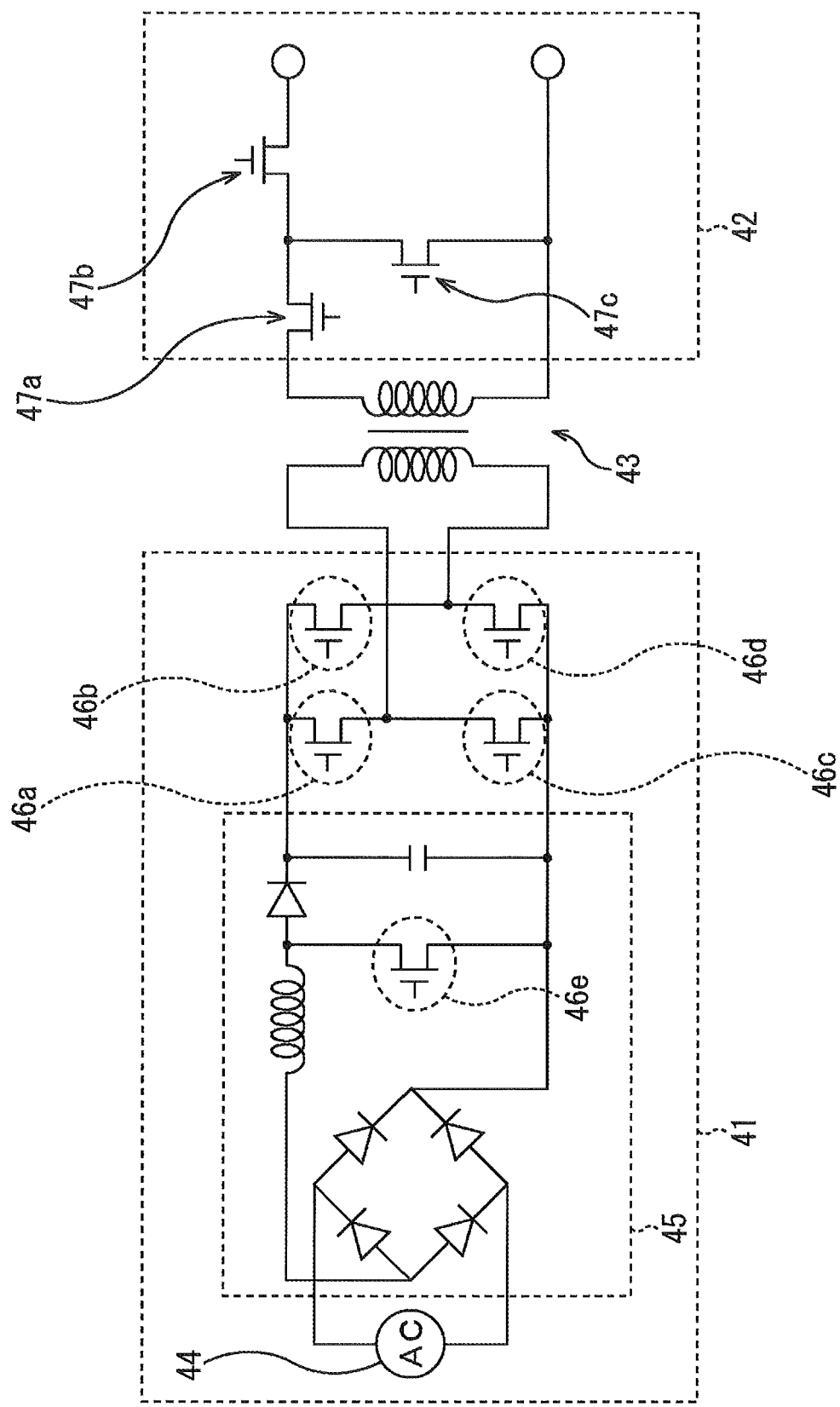
FIG. 14 is a connection diagram illustrating a schematic configuration of a power supply device according to a fourth embodiment.

The fourth embodiment discloses a power supply device to which one type of AlGaN/GaN HEMI selected from the first to third embodiments and various modifications is applied. FIG. 14 is a connection diagram illustrating a schematic configuration of a power supply device according to the fourth embodiment.

The power supply device according to the fourth embodiment is configured to include a high voltage primary circuit 41, a low voltage secondary circuit 42, and a transformer 43 disposed between the primary circuit 41 and the secondary circuit 42. The primary circuit 41 is configured to include an AC power supply 44, a so-called bridge rectifier circuit 45, and multiple (four in this case) switching elements 46a, 46b, 46c, and 46d. In addition, the bridge rectifier circuit 45 has a switching element 46e. The secondary circuit 42 includes multiple (three in this case) switching elements 47a, 47b, and 47c.

In the fourth embodiment, the switching elements 46a, 46b, 46c, 46d, and 46e of the primary circuit 41 may be one type of AlGaN/GaN HEMT selected from the first to third embodiments and various modifications. By contrast, the switching elements 47a, 47b, and 47c of the secondary circuit 22 are ordinary MIS-FETs using silicon.

According to the fourth embodiment, an AlGaN/GaN HEMT with high reliability and high breakdown voltage capable of relaxing the lattice mismatch between the electron transit layer and the electron supply layer and capable of sufficiently achieving both high output power and improved breakdown voltage may be applied to a high voltage circuit. As a result, a highly reliable and powerful power supply circuit is provided.

FIFTH EMBODIMENT

Figure 15:
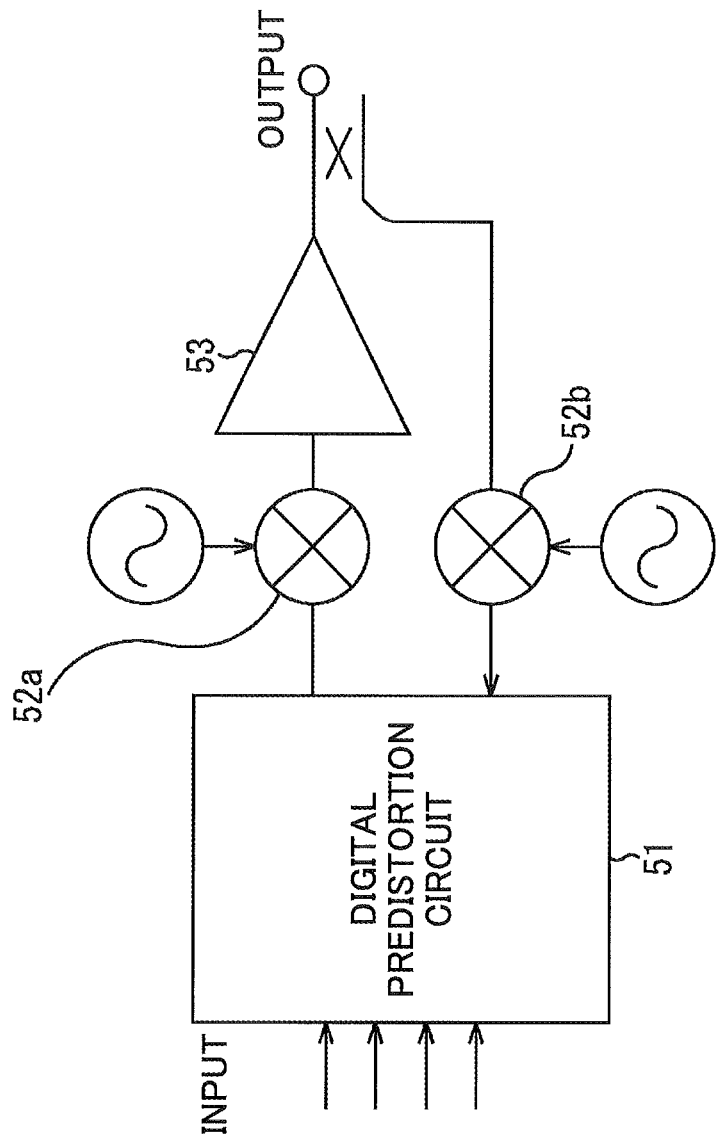
FIG. 15 is a connection diagram illustrating a schematic configuration of a high-frequency amplifier according to a fifth embodiment.

The fifth embodiment discloses a power supply device to which one type of AlGaN/GaN HEMT selected from the first to third embodiments and various modifications is applied. FIG. 15 is a connection diagram illustrating a schematic configuration of a high frequency amplifier according to a fifth embodiment.

The high-frequency amplifier according to the present embodiment includes a digital predistortion circuit 51, mixers 52a and 52b, and a power amplifier 53. The digital predistortion circuit 51 is configured to carry out nonlinear distortion compensation of an input signal. The mixer 52a mixes an input signal of which nonlinear distortion compensation has been carried out and an alternating current (AC) signal. The power amplifier 53 is configured to amplify the input signal mixed with the AC signal and includes one type of AlGaN/GaN HEMT selected from the first to third embodiments and various modifications. In FIG. 15, an output signal is mixed with an AC signal in the mixer 52b by switching of the switching elements, the mixed signals may be sent to the digital predistortion circuit 51.

According to the fifth embodiment, an AlGaN/GaN HEMT with high reliability and high breakdown voltage capable of relaxing the lattice mismatch between the electron transit layer and the electron supply layer and capable of sufficiently achieving both high output power and improved breakdown voltage may be applied to a frequency amplifier. As a result, a highly reliable high frequency amplifier with high breakdown voltage may be provided.

OTHER EMBODIMENTS

In the first to fifth embodiments and various modifications, an AlGaN/GaN HEMT is exemplified as a compound semiconductor device. As a compound semiconductor device, the following examples of GaN HEMT may also be applied other than the above-described AlGaN/GaN HEMT.

ANOTHER EXAMPLE 1 OF HEMT

In this example 1, an InAlN/GaN HEMT is disclosed as a compound semiconductor device. InAlN and GaN are compound semiconductors that are capable of making the lattice constants close to each other depending on their compositions. In applying this example 1 to the first to fifth embodiments and the modifications described above, the electron transit layer is formed of i-GaN and the electron supply layer is formed of InAlN. The electron supply layer is disposed above the electron transit layer, and includes a first region, and a second region covering the first region from at least a bottom part of the second region and having a composition higher in Al than the first region. In InAlN/GaN HEMT, since piezoelectric polarization hardly occurs, two-dimensional electron gas is generated mainly by spontaneous polarization of InAlN.

According to this example 1, as with the above-described AlGaN/GaN HEMT, a highly reliable InAlN/GaN HEMT capable of relaxing the lattice mismatch between the electron transit layer and the electron supply layer, as well as sufficiently achieving both high output power and improved breakdown voltage may be provided.

ANOTHER EXAMPLE 2 OF HEMT

In this example 2, an InAlGaN/GaN HEMT is disclosed as a compound semiconductor device. GaN and InAlGaN are compound semiconductors in which the lattice constant of the latter (InAlGaN) is made smaller than that of the former (GaN) due to composition. In applying this example 2 to the first to fifth embodiments and the modifications described above, the electron transit layer is formed of i-GaN and the electron supply layer is formed of InAlGaN. The electron supply layer is disposed above the electron transit layer, and includes a first region, and a second region covering the first region from at least a bottom part of the second region and having a composition higher in Al than the first region.

According to this example 2, as with the above-described AlGaN/GaN HEMT, a highly reliable InAlGaN/GaN HEMT capable of relaxing the lattice mismatch between the electron transit layer and the electron supply layer, as well as sufficiently achieving both high output power and improved breakdown voltage may be provided.

According to one aspect of the embodiments, a highly reliable compound semiconductor device capable of relaxing the lattice mismatch between the electron transit layer and the electron supply layer and sufficiently achieving both high output and improved breakdown voltage is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:
1. A compound semiconductor device comprising:
an electron transit layer;
an electron supply layer disposed above the electron transit layer and including a first region and a second region, the second region having a composition higher in Al than the first region and having at least a bottom part covered with the first region;
a gate electrode disposed on the first region; and
a source electrode disposed on the second region,
the second region has a thickness smaller than a thickness of a portion of the first region that is under the second region,
an end of the second region that faces the gate electrode in a cross-sectional view is separated from an end of the gate electrode that faces the source electrode,
the electron transit layer is separated in a thickness direction from the second region via the portion of the first region having the thickness greater than the thickness of the second region, and
the gate electrode disposed directly on the first region, wherein the electron transit layer has a low two-dimensional electron gas concentration in a portion of the electron transit layer located immediately below the gate electrode, and the source electrode disposed directly on the second region, wherein the electron transit layer has a high two-dimensional electron gas concentration in a portion of the electron transit layer located immediately below the source electrode.

2. The compound semiconductor device as claimed in claim 1, wherein the second region includes a part of an upper surface of the electron supply layer.

3. The compound semiconductor device as claimed in claim 1, wherein the end of the second region that faces the gate electrode in a cross-sectional view is aligned flush with an end of the source electrode that faces the gate electrode.

4. The compound semiconductor device as claimed in claim 1, wherein the end of the second region that faces the gate electrode in a cross-sectional view is extended toward the gate electrode with respect to an end of the source electrode that faces the gate electrode.

5. The compound semiconductor device as claimed in claim 1, wherein the second region contains an n-type impurity in at least an upper portion in a thickness direction.

6. The compound semiconductor device as claimed in claim 5, wherein the second region contains an n-type impurity throughout a thickness direction.

7. The compound semiconductor device as claimed in claim 5, wherein the second region contains an n-type impurity only in an upper portion in the thickness direction.

8. The compound semiconductor device as claimed in claim 5, wherein the second region contains an n-type impurity so as to have a higher concentration toward an upper surface in the thickness direction.

9. The compound semiconductor device as claimed in claim 1, further comprising:
a drain electrode, wherein
the electron supply layer includes a third region covering the first region from at least a bottom part of the third region and having a composition higher in Al than the first region, and the drain electrode is formed above the third region, and wherein
the first region is formed between the electron transit layer and the second region, and between the electron transit layer and the third region.

10. A method of fabricating a compound semiconductor device, the method comprising:
forming an electron transit layer;
forming an electron supply layer above the electron transit layer including a first region and a second region, the second region having a composition higher in Al than the first region and having at least a bottom part covered with the first region; and
forming a gate electrode and a source electrode on the first region and the second region, respectively,
the second region has a thickness smaller than a thickness of a portion of the first region that is under the second region,
an end of the second region that faces the gate electrode in a cross-sectional view is separated from an end of the gate electrode that faces the source electrode,
the electron transit layer is separated in a thickness direction from the second region via the portion of the first region having the thickness greater than the thickness of the second region, and
the gate electrode disposed directly on the first region, wherein the electron transit layer has a low two-dimensional electron gas concentration in a portion of the electron transit layer located immediately below the gate electrode, and the source electrode disposed directly on the second region, wherein the electron transit layer has a high two-dimensional electron gas concentration in a portion of the electron transit layer located immediately below the source electrode.

11. The method as claimed in claim 10, wherein the second region includes a part of an upper surface of the electron supply layer.

12. The method as claimed in claim 10, wherein
the forming of the electron supply layer having the first region and the second region includes
forming a first compound semiconductor layer above the electron transit layer, and
forming a second compound semiconductor layer on a part of an upper surface of the first compound semiconductor layer, the second compound semiconductor layer having a composition higher in Al than the first compound semiconductor layer.

13. The method as claimed in claim 10, wherein
the forming of the electron supply layer having the first region and the second region includes
forming a compound semiconductor layer above the electron transit layer, and
heating the compound semiconductor layer to increase Al in the composition of only a part of an upper surface of the compound semiconductor layer.

14. The method as claimed in claim 13, wherein the forming of the electron supply layer having the first region and the second region further includes forming a mask on the compound semiconductor layer, the mask having an opening as a portion to be the second region; and
performing heat treatment.

15. The method as claimed in claim 13, wherein the forming of the electron supply layer having the first region and the second region further includes
heating an entire surface of the compound semiconductor layer; and
removing a portion of the compound semiconductor layer having a composition of increased Al while leaving only a portion of the compound semiconductor layer having the composition of increased Al to be the second region.

16. The method as claimed in claim 10, wherein the end of the second region that faces the gate electrode in a cross-sectional view is aligned flush with an end of the source electrode that faces the gate electrode.

17. The method as claimed in claim 10, wherein the end of the second region that faces the gate electrode in a cross-sectional view is extended toward the gate electrode with respect to an end of the source electrode that faces the gate electrode.

18. A power supply circuit comprising:
a transformer; and
a high voltage circuit and a low voltage circuit sandwiching the transformer, the high voltage circuit includes a transistor, and the transistor includes
an electron transit layer;
an electron supply layer disposed above the electron transit layer, and including a first region and a second region, the second region having a composition higher in Al than the first region and having at least a bottom part covered with the first region;
a gate electrode disposed on the first region; and
a source electrode disposed on the second region, wherein
the second region has a thickness smaller than a thickness of a portion of the first region that is under the second region,
an end of the second region that faces the gate electrode in a cross-sectional view is separated from an end of the gate electrode that faces the source electrode,
the electron transit layer is separated in a thickness direction from the second region via the portion of the first region having the thickness greater than the thickness of the second region, and
the gate electrode disposed directly on the first region, wherein the electron transit layer has a low two-dimensional electron gas concentration in a portion of the electron transit layer located immediately below the gate electrode, and the source electrode disposed directly on the second region, wherein the electron transit layer has a high two-dimensional electron gas concentration in a portion of the electron transit layer located immediately below the source electrode.

19. The compound semiconductor device as claimed in claim 1, wherein the electron transit layer is formed of i-GaN and the electron supply layer is formed of InAlN or InAlGaN.

20. The method as claimed in claim 10, wherein the electron transit layer is formed of i-GaN and the electron supply layer is formed of InAlN or InAlGaN.

21. The power supply circuit as claimed in claim 18, wherein the electron transit layer is formed of i-GaN and the electron supply layer is formed of InAlN or InAlGaN.

* * * * *